US005802180A

United States Patent [19]

Abel et al.

[11] Patent Number: 5,802,180

[45] Date of Patent: *Sep. 1, 1998

[54] METHOD AND APPARATUS FOR EFFICIENT PRESENTATION OF HIGH-QUALITY THREE-DIMENSIONAL AUDIO INCLUDING AMBIENT EFFECTS

[75] Inventors: Jonathan Stuart Abel, Palo Alto; Scott Haines Foster, Sunol, both of Calif.

[73] Assignee: Aureal Semiconductor Inc., Fremont, Calif.

[*] Notice: The term of this patent shall not extend beyond the expiration date of Pat. No. 5,596,644.

[21] Appl. No.: 785,709

[22] Filed: Jan. 17, 1997

Related U.S. Application Data

[63] Continuation-in-part of Ser. No. 330,240, Oct. 27, 1994, Pat. No. 5,596,644.

[51] Int. Cl.[6] .................... H04S 5/00; H03G 3/00

[52] U.S. Cl. .................... 381/17; 381/63

[58] Field of Search .................... 381/17, 63, 1, 381/18

[56] References Cited

U.S. PATENT DOCUMENTS

| | | | |
|---|---|---|---|
| 4,731,848 | 3/1988 | Kendall et al. . | |
| 4,817,149 | 3/1989 | Myers . | |
| 5,596,644 | 1/1997 | Abel et al. | 381/17 |

FOREIGN PATENT DOCUMENTS

| | | |
|---|---|---|
| 0142213 | 5/1985 | European Pat. Off. . |
| 0357402 | 3/1990 | European Pat. Off. . |
| 0448758 | 10/1991 | European Pat. Off. . |
| 2238936 | 6/1991 | United Kingdom . |
| 9613962 | 5/1996 | WIPO . |

OTHER PUBLICATIONS

Martens, "Principal Components Analysis and Resynthesis of Spectral Cues to Perceived Direction," *ICMC Proceedings*, 1987, pp. 274–281.

Kistler et al., "A Model of Head–Related Transfer Functions Based on Principal Components Analysis and Minimum–Phase Reconstruction," *J. Acoust. Soc. Am.*, Mar. 1992, pp. 1637–1647.

Wenzel, "Localization in Virtual Acoustic Displays," *Presence*, vol. 1, No. 1, 1992, pp. 80–107.

Wightman et al., "Multidimensional Scaling Analysis of Head–Related Transfer Functions," *IEEE Workshop on Appl. of Sig. Proc. to Audio & Acoust.*, Oct. 1993.

Begault, "3–D Sound for Virtual Reality and Multimedia," Academic Press, 1994, pp. v–ix, 52–61, 99–105, 123–125, 135–139, 144–146, 164–174, 179–190, 205–210.

*Primary Examiner*—Forester W. Isen
*Attorney, Agent, or Firm*—David N. Lathron; Thomas A. Gallagher

[57] ABSTRACT

Spatialization of soundfields is accomplished by filtering audio signals using filters having unvarying frequency response characteristics and amplifying signals using amplifier gains adapted in response to signals representing sound source location and/or listener position. The filters are derived using a singular value decomposition process which finds the best set of component impulse responses to approximate a given target set of impulse responses corresponding to head related transfer functions. Efficient implementations for rendering reflection effects, air absorption losses and other ambient effects, and for spatializing multiple sound sources and/or generating multiple output signals are disclosed.

17 Claims, 6 Drawing Sheets

METHOD AND APPARATUS FOR EFFICIENT PRESENTATION OF HIGH-QUALITY THREE-DIMENSIONAL AUDIO INCLUDING AMBIENT EFFECTS

CROSS REFERENCE TO OTHER RELATED APPLICATIONS

This application is a continuation-in-part of U.S. patent application Ser. No. 08/330,240 filed Oct. 27, 1994, issuing as U.S. Pat. No. 5,596,644.

TECHNICAL FIELD

The invention relates in general to the presentation of audio signals conveying an impression of a three-dimensional sound field and more particularly to an efficient method and apparatus for high-quality presentations.

BACKGROUND

There is a growing interest to improve methods and systems for audio displays which can present audio signals conveying accurate impressions of three-dimensional sound fields. Such audio displays utilize techniques which model the transfer of acoustic energy in a soundfield from one point to another. A frequency-domain form of such models is referred to as an acoustic transfer function (ATF) and may be expressed as a function $H(d,\theta,\phi,\omega)$ of frequency $\omega$ and relative position $(d,\theta,\phi)$ between two points, where $(d,\theta,\phi)$ represents the relative position of the two points in polar coordinates. Other coordinate systems may be used.

Throughout the following discussion, more particular mention is made of various frequency-domain transfer functions; however, it should be understood that corresponding time-domain impulse response representations exist which may be expressed as a function of time t and relative position between points, or $h(d,\theta,\phi,t)$. The principles and concepts discussed here are applicable to either domain.

An ATF may model the acoustical properties of a test subject. In particular, an ATF which models the acoustical properties of a human torso, head, ear pinna and ear canal is referred to as a head-related transfer function (HRTF). A HRTF describes, with respect to a given individual, the acoustic levels and phases which occur near the ear drum in response to a given soundfield. The HRTF is typically a function of both frequency and relative orientation between the head and the source of the soundfield. A HRTF in the form of a free-field transfer function (FFTF) expresses changes in level and phase relative to the levels and phase which would exist if the test subject was not in the soundfield; therefore, a HRTF in the form of a FFTF may be generalized as a transfer function of the form $H(\theta,\phi,\omega)$. The effects of distance can be approximated by amplitude attenuation as a function of the distance. In addition, high-frequency losses can be synthesized by various functions of distance. Throughout this discussion, the term HRTF and the like should be understood to refer to FFTF forms unless a contrary meaning is made clear by explanation or by context.

Many applications comprise acoustic displays utilizing one or more HRTF in attempting to "spatialize" or create a realistic three-dimensional aural impression. Acoustic displays can spatialize a sound by modelling the attenuation and delay of acoustic signals received at each ear as a function of frequency $\omega$ and apparent direction $(\theta,\phi)$ relative to head orientation. An impression that an acoustic signal originates from a particular relative direction $(\theta,\phi)$ can be created in a binaural display by applying an appropriate HRTF to the acoustic signal, generating one signal for presentation to the left ear and a second signal for presentation to the right ear, each signal changed in a manner that results in the respective signal that would have been received at each ear had the signal actually originated from the desired relative direction.

Empirical evidence has shown that the human auditory system utilizes various cues to identify or "localize" the relative position of a sound source. The relationship between these cues and relative position are referred to here as listener "localization characteristics" and may be used to define HRTF. The differences in the amplitude and the time of arrival of soundwaves at the left and right ears, referred to as the interaural intensity difference (IID) and the interaural time difference (ITD), respectively, provide important cues for localizing the azimuth or horizontal direction of a source. Spectral shaping and attenuation of the soundwave provides important cues used to localize elevation or vertical direction of a source, and to identify whether a source is in front of or in back of a listener.

Although the type of cues used by nearly all listeners is similar, localization characteristics differ. The precise way in which a soundwave is altered varies considerably from one individual to another because of considerable variation in the size and shape of human torsos, heads and ear pinnae. Under ideal situations, the HRTF incorporated into an acoustic display is the personal HRTF of the actual listener because a universal HRTF for all individuals does not exist. Additional information regarding the suitability of shared HRTF may be obtained from Wightman, et al., "Multidimensional Scaling Analysis of Head-Related Transfer Functions," *IEEE Workshop on Applications of Sig. Proc. to Audio and Acoust.*, October 1993.

In many practical systems, however, several HRTF known to work well with a variety of individuals are compiled into a library to achieve a degree of sharing. The most appropriate HRTF is selected for each listener. Additional information may be obtained from Wenzel, et al., "Localization Using Nonindividualized Head-Related Transfer Functions," *J. Acoust. Soc. Am.*, vol. 94, July 1993, pp. 111–123.

The realism of an acoustic display can be enhanced by including ambient effects such as high-frequency losses due to air absorption and nonuniform source radiation patterns. Another important ambient effect is caused by reflections. In most environments, a soundfield comprises soundwaves arriving at a particular point, say at an ear, along a direct path from the sound source and along paths reflecting off one or more surfaces of walls, floor, ceiling and other objects. A soundwave arriving after reflecting off one surface is referred to as a first-order reflection. The order of the reflection increases by one for each additional reflective surface along the path. The direction of arrival for a reflection is generally not the same as that of the direct-path soundwave and, because the propagation path of a reflected soundwave is longer than a direct-path soundwave, reflections arrive later. In addition, the amplitude and spectral content of a reflection will generally differ because of energy absorbing qualities of the reflective surfaces. The combination of high-order reflections produces the diffuse soundfields associated with reverberation.

A HRTF may be constructed to model ambient affects; however, a more flexible display would utilize HRTF which model only the direct-path response for some given distance and include ambient effects synthetically. The effects of a reflection, for example, may be synthesized by applying a direct-path HRTF of appropriate direction to a delayed and filtered version of the direct-path signal. The appropriate direction is the direction of arrival at the ear may be established by tracing the propagation path of the reflected soundwave. The delay accounts for the reflective path being longer than the direct path. The filtering alters the amplitude and spectrum of the delayed soundwave to account for acoustical properties of reflective surfaces, air absorption, nonuniform source radiation patterns and other propagation effects. Thus, a HRTF can be applied to synthesize each reflection included in the acoustic display.

In many acoustic displays, HRTF are implemented as digital filters. Considerable computational resources are required to implement accurate HRTF because they are very complex functions of direction and frequency. The implementation cost of a high-quality display with accurate HRTF is roughly proportional to the complexity and number of filters used because the amount of computation required to perform the filters is significant as compared to the amount of computation required to perform all other functions. An efficient implementation of HRTF filters is needed to reduce implementation costs of high-quality acoustic displays. Efficiency is very important for practical displays of complex soundfields which include many reflections. The complexity is essentially doubled in binaural displays and increases further for multiple sources and/or multiple listeners.

The term "filter" and the like as used here refer to devices which perform an operation equivalent to convolving a time-domain signal with an impulse response. Similarly, the term "filtering" and the like as used here refer to processes which apply such a "filter" to a time-domain signal.

One technique used to increase the efficiency of spatializing late-arriving reflections is disclosed in U.S. Pat. No. 4,731,848. According to this technique, direct-path soundwaves and first-order reflections are processed in a manner similar to that discussed above. The diffuse soundwaves produced by higher-order reflections are synthesized by a reverberation network prior to spectral shaping and delays provided by "directionalizers."

Another technique used to increase the efficiency of spatializing early reflections is disclosed in U.S. Pat. No. 4,817,149. According to this technique, three separate processes are used to spatialize the direct-path soundwave, early reflections and late reflections. The direct-path soundwave is spatialized by providing front/back and elevation cues through spectral shaping, and is spatialized in azimuth by including either ITD or IID. The early reflections are spatialized by propagation delays and azimuth cues, either ITD or IID, and are spectrally shaped as a group to provide "focus" or a sense of spaciousness. The late reflections are spatialized in a manner similar to that done for early reflections except that reverberation and randomized azimuth cues are used to synthesize a more diffuse soundfield.

These techniques improve the efficiency of spatializing reflections but they do not include other ambient effects, do not improve the efficiency of spatializing a direct-path soundwave, and do not provide a way to more efficiently spatialize binaural displays, to spatialize multiple sources or present a spatialized display to multiple listeners.

A technique used to more efficiently spatialize an audio signal is implemented in the UltraSound™ multimedia sound card by Advanced Gravis Computer Technology Ltd., Burnaby, British Columbia, Canada. According to this technique, an initial process records several prefiltered versions of an audio signal. The prefiltered signals are obtained by applying HRTF representing several positions, say four horizontal positions spaced apart by 90 degrees and one or two positions of specified elevation. Spatialization is accomplished by mixing the prefiltered signals. In effect, spatialization is accomplished by panning between fixed sound sources. The spatialization process is fairly efficient and has an intuitive appeal; however, it does not provide very good spatialization unless a fairly large number of prefiltered signals are used. This is because each of the prefiltered signals include ITD, and a soundwave appearing to originate from an intermediate point cannot be reasonably approximated by a mix of prefiltered signals unless the signals represent directions fairly close to one another. Limited storage capacity usually restrict the number of prefiltered signals which can be stored. In addition, the technique imposes a rather serious disadvantage in that neither the HRTF nor the audio source can be changed without rerecording the prefiltered signals. This technique is described briefly in Begault, "3-D Sound for Virtual Reality and Multimedia," Academic Press, Inc., 1994, p. 210.

As explained above, accurate HRTF are expensive to implement because they are complex functions of direction and frequency. Research discussed in Martens, "Principal Components Analysis and Resynthesis of Spectral Cues to Perceived Direction," *ICMC Proceedings*, 1987, pp. 274–281, and in Kistl et al., "A Model of Head-Related Transfer Functions Based on Principal Components Analysis and Minimum-Phase Reconstruction," *J. Acoust. Soc. Am.*, Mar. 1992, pp. 1637–1647, used principal component analysis to develop the concept that HRTF can be approximated fairly well by a small number of fixed-frequency-response basis functions. In particular, Kistler, et al. showed that as few as five log-magnitude basis functions could reasonably represent a direction-dependent portion of HRTF responses, referred to as directional transfer functions (DTF), for each ear of ten different test subjects. Direction-independent aspects such as ear canal resonance were excluded from the principal component analysis. Phase responses of the HRTF were approximated by ITD which were assumed to be frequency independent.

Kistler, et al. showed that binaural HRTF for a particular individual and specified direction can be approximated by scaling the log-magnitude basis functions with a set of weights, combining the scaled functions to obtain composite log-magnitude response functions representing DTF for each ear, deriving two minimum phase filters from the log-magnitude response functions, adding excluded direction-independent characteristics such as ear canal resonance to derive HRTF representations from the DTF representations, and calculating a delay for ITD to simulate phase response. Unfortunately, these basis functions do not provide for any improvement in implementation efficiency of HRTF. In addition, Kistler, et al. concluded that the principal component weights for the five basis functions were very complex functions of direction and could not be easily modeled.

There remains a need for a method and an apparatus to efficiently implement accurate HRTF, particularly for acoustic displays which spatialize multiple sources and/or generate unique displays for multiple listeners and which include various ambient effects such as those discussed above.

Disclosure of Invention

It is an object of the present invention to provide for a method and apparatus to efficiently implement accurate HRTF for high-quality acoustic displays.

Other objects and advantages of the present invention may be appreciated by referring to the following discussion and to the accompanying drawings.

In accordance with the teachings of one aspect of the present invention, a method for providing an acoustic display comprises receiving audio signals and direction signals representing one or more sources of aural information, receiving one or more ambient signals representing ambient effects, generating first signals in response to the audio signals, generating a plurality of filtered signals by filtering the first signals with filters having respective unvarying impulse responses which are substantially mutually orthogonal, and generating one or more output signals in response to the filtered signals. For a display receiving a plurality of audio signals, a respective first signal is generated by combining the audio signals according to a respective set of weights adapted in response to the direction signals and the ambient signals. For a display generating a plurality of output signals, a respective output signal is generated by combining the filtered signals according to a respective set of weights adapted in response to the direction signals and the ambient signals.

Throughout this discussion, references to binaural presentations should be understood to also refer to presentations utilizing more than two output signals unless the context of the discussion makes it clear that only a two-channel presentation is intended.

The present invention may be implemented in many different embodiments and incorporated into a wide variety of devices. It is contemplated that the present invention will be most frequently practiced using digital signal processing techniques implemented in software and/or so called firmware; however, the principles and teachings may be applied using other techniques and implementations. The various features of the present invention and its preferred embodiments may be better understood by referring to the following discussion and to the accompanying drawings in which like reference numbers refer to like features. The contents of the discussion and the drawings are provided as examples only and should not be understood to represent limitations upon the scope of the present invention.

FIGS. *5a–5b* are functional block diagrams of filter-amplifier networks.

Figure 6:
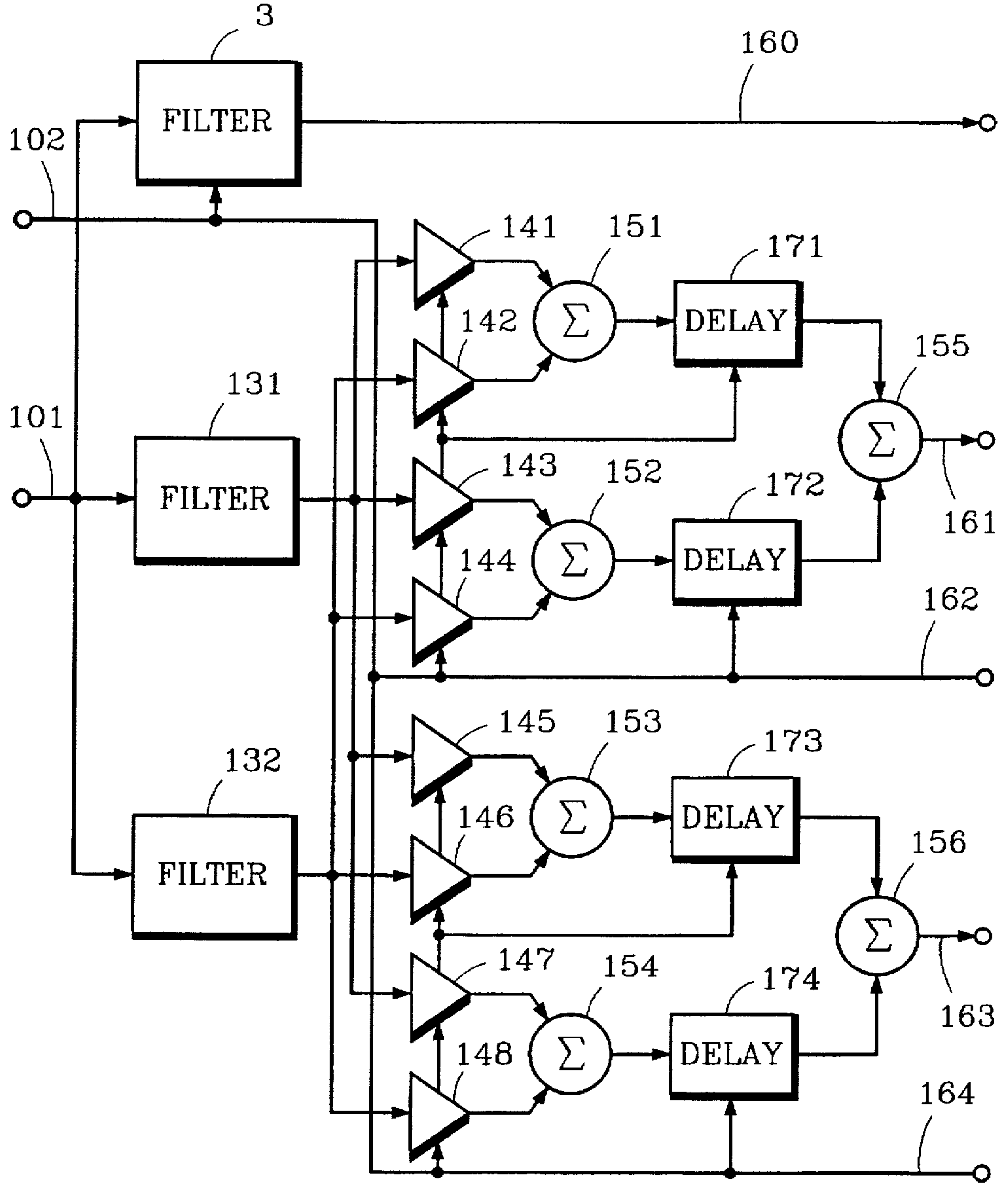
Figure 7A:
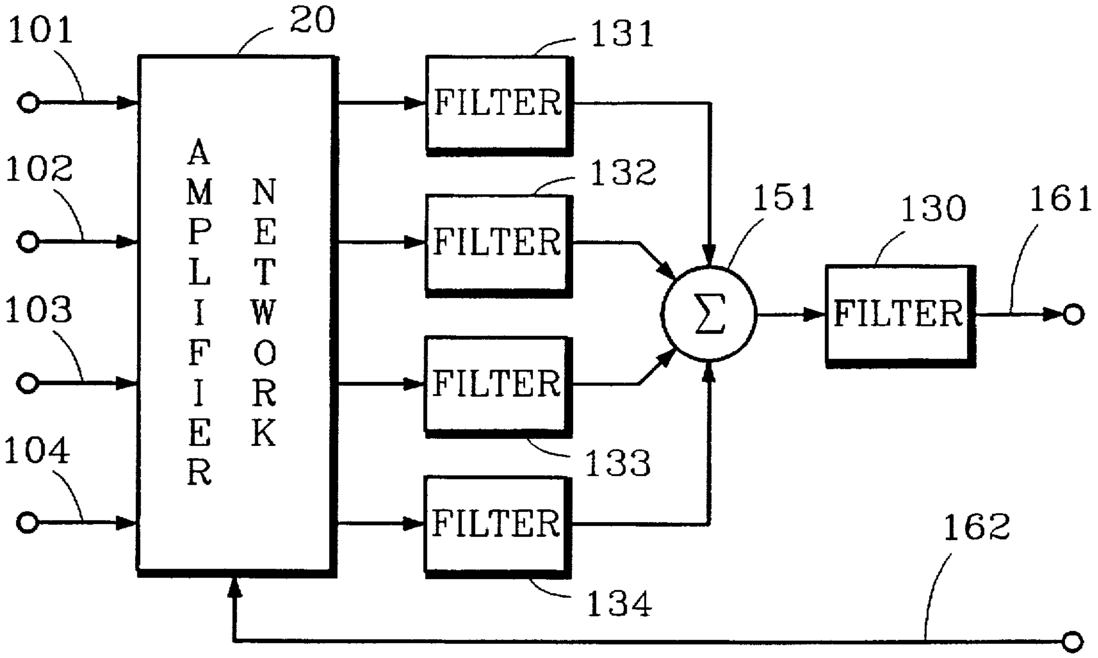
Figure 7B:
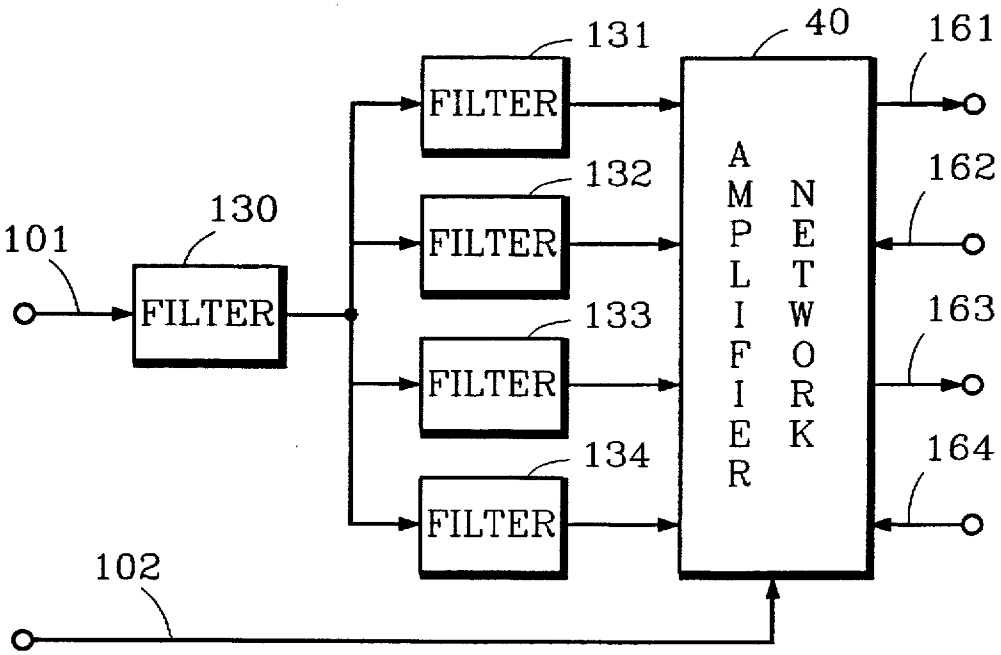

FIG. 6 is a function block diagram illustrating one implementation of a HRTF according to the present invention comprising a hybrid structure of filters and an amplifier network in which a single set of filters with unvarying frequency response characteristics spatializes reflective effects for a single audio source and multiple output signals.

FIGS. *7a* and *7b* are functional block diagrams illustrating implementations of HRTF according to the present invention in which filters having unvarying frequency response characteristics were derived from impulse responses representing ATF such as directional transfer functions.

MODES FOR CARRYING OUT THE INVENTION

Multiple Source Signals

Figure 1:
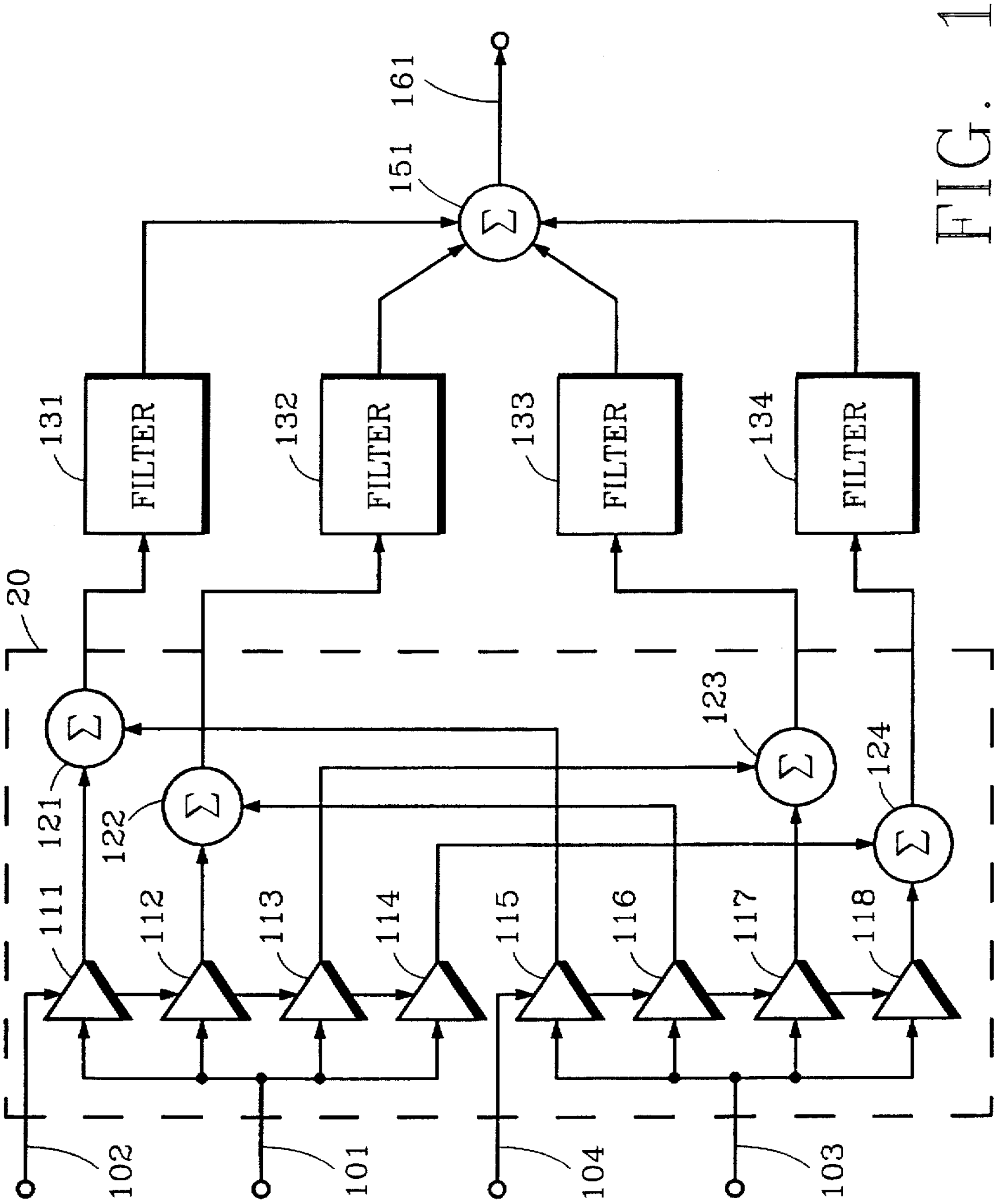
FIG. 1 is a functional block diagram illustrating one implementation of HRTF according to the present invention for use in an acoustic display for presentation of multiple sources in one output signal.

A functional block diagram shown in FIG. 1 illustrates one structure of a device according to the teachings of the present invention which implements HRTF for multiple audio sources. An audio signal representing a first audio source is received from path 101, amplified by a first group of amplifiers 111–114 and passed to combiners 121–124. Another audio signal representing a second audio source is received from path 103, amplified by a second group of amplifiers 115–118 and passed to combiners 121–124. Combiner 121 combines amplified signals received from amplifiers 111 and 115 and passes the resulting intermediate signal to filter 131. Combiners 122–124 combine amplified signals received from other amplifiers as shown and pass the resulting intermediate signals to filters 132–134. Filters 131–134 each apply a filter to a respective intermediate signal and pass the resulting filtered signals to combiner 151. Combiner 151 combines the filtered signals and passes the resulting output signal along path 161.

Ambient and direction signals received from paths 102 and 104 represent the desired ambient characteristics and apparent direction of the sources of the audio signals received from paths 101 and 103. Respective gains of amplifiers 111–114 in the first group of amplifiers are adapted in response to the one or more signals received from path 102 and respective gains of amplifiers 115–118 in the second group of amplifiers are adapted in response to the one or more signals received from path 104.

The structure shown in FIG. 1 implements HRTF for two audio sources and can be extended to implement HRTF for additional sources by adding a group of amplifiers for each additional source and coupling the output of each amplifier in a group to a respective combiner. The illustrated structure comprises four filters but as few as two filters may be used. Very accurate HRTF can generally be implemented using no more than twelve to sixteen filters.

Multiple Output Signals

Figure 2:
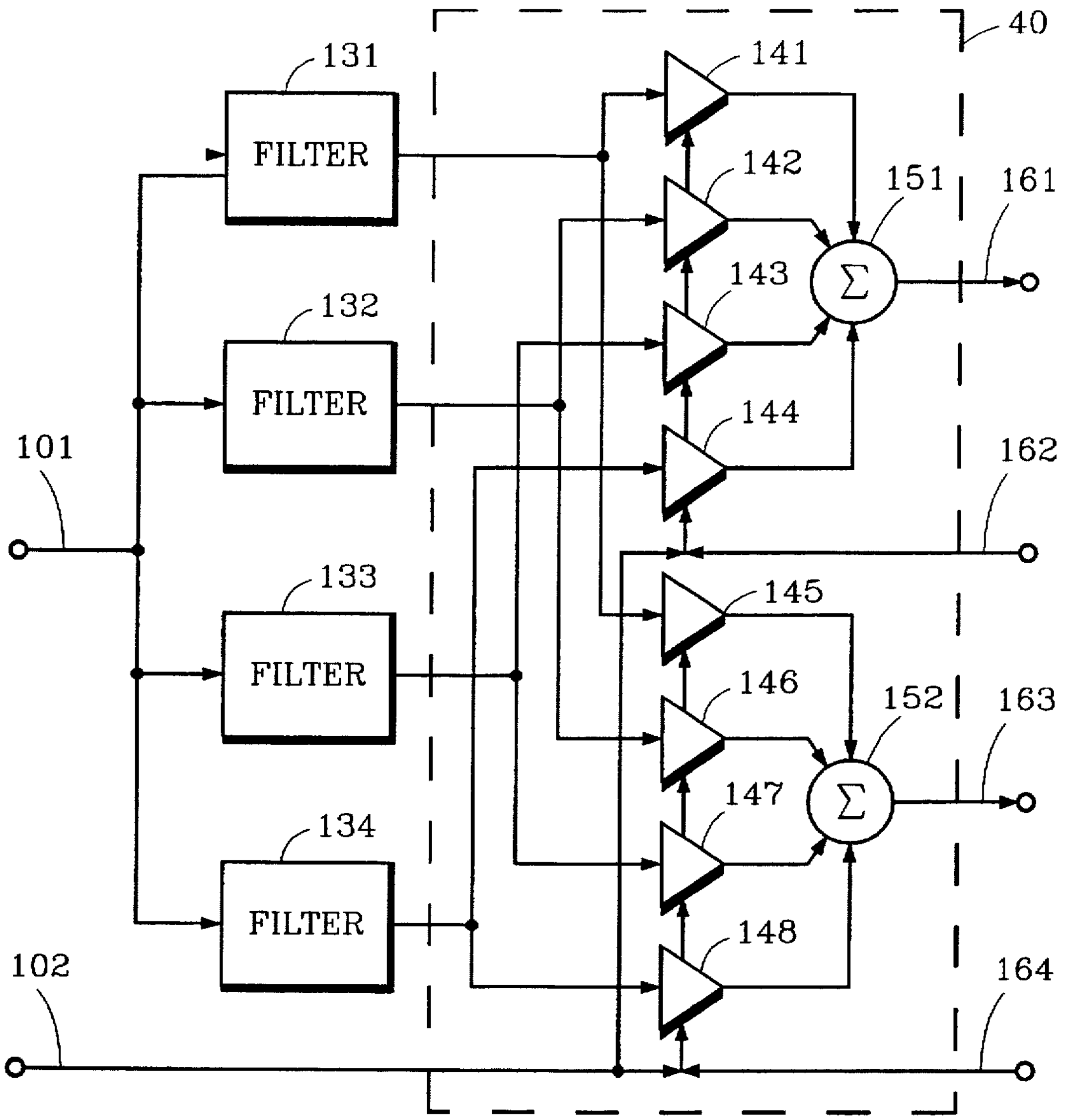
FIG. 2 is a functional block diagram illustrating one implementation of HRTF according to the present invention for use in an acoustic display for presentation of a single source in multiple output signals.

A functional block diagram shown in FIG. 2 illustrates one structure of a device according to the teachings of the present invention which implements HRTF for multiple output signals. Each one of filters 131–134 apply a filter to an audio signal received from path 101 representing an audio source. Filter 131 passes the filtered signal to amplifiers 141 and 145 which amplify the filtered signal. Filters 132–134 pass filtered signals to other amplifiers as shown and each amplifier amplifies a respective filtered signal. Combiner 151 combines amplified signals received from amplifiers 141–144 and passes the resulting first output signal along path 161. Combiner 152 combines amplified signals received from amplifiers 145–148 and passes the resulting second output signal along path 162.

A direction signal received from path 102 represents the desired direction of the source of the audio signal received from path 101. Position signals received from paths 162 and 164 represent position and/or orientation of one or more listeners. For example, the two position signals may represent position information for each ear of one listener or position information for two listeners. Ambient signals representing ambient characteristics may be received from any or all of paths 102, 162 and 164. In the embodiment illustrated, respective gains of amplifiers 141–144 in a first group of amplifiers are adapted in response to the signals received from paths 102 and 162, and respective gains of amplifiers 145–148 in a second group of amplifiers are adapted in response to signals received from paths 102 and 164. In alternative embodiments, respective gains of amplifiers in a group of amplifiers may be adapted in response to only the direction signal and/or ambient signal received from path 102 or only a respective position signal and/or ambient signal.

The multiple output signals may be used to provide binaural presentation to one or more listeners, monaural presentation to two or more listeners or a combination of binaural and monaural presentations. As explained above, the term "binaural" refers to presentations comprising two or more output signals.

The structure shown in FIG. 2 implements HRTF for two output signals and can be extended to implement HRTF for additional output signals by adding a group of amplifiers for each additional output and coupling the input of each amplifier in a group to a respective filter. The illustrated structure comprises four filters but two or more filters may be used as desired.

Multiple Source and Output Signals

Figure 3:
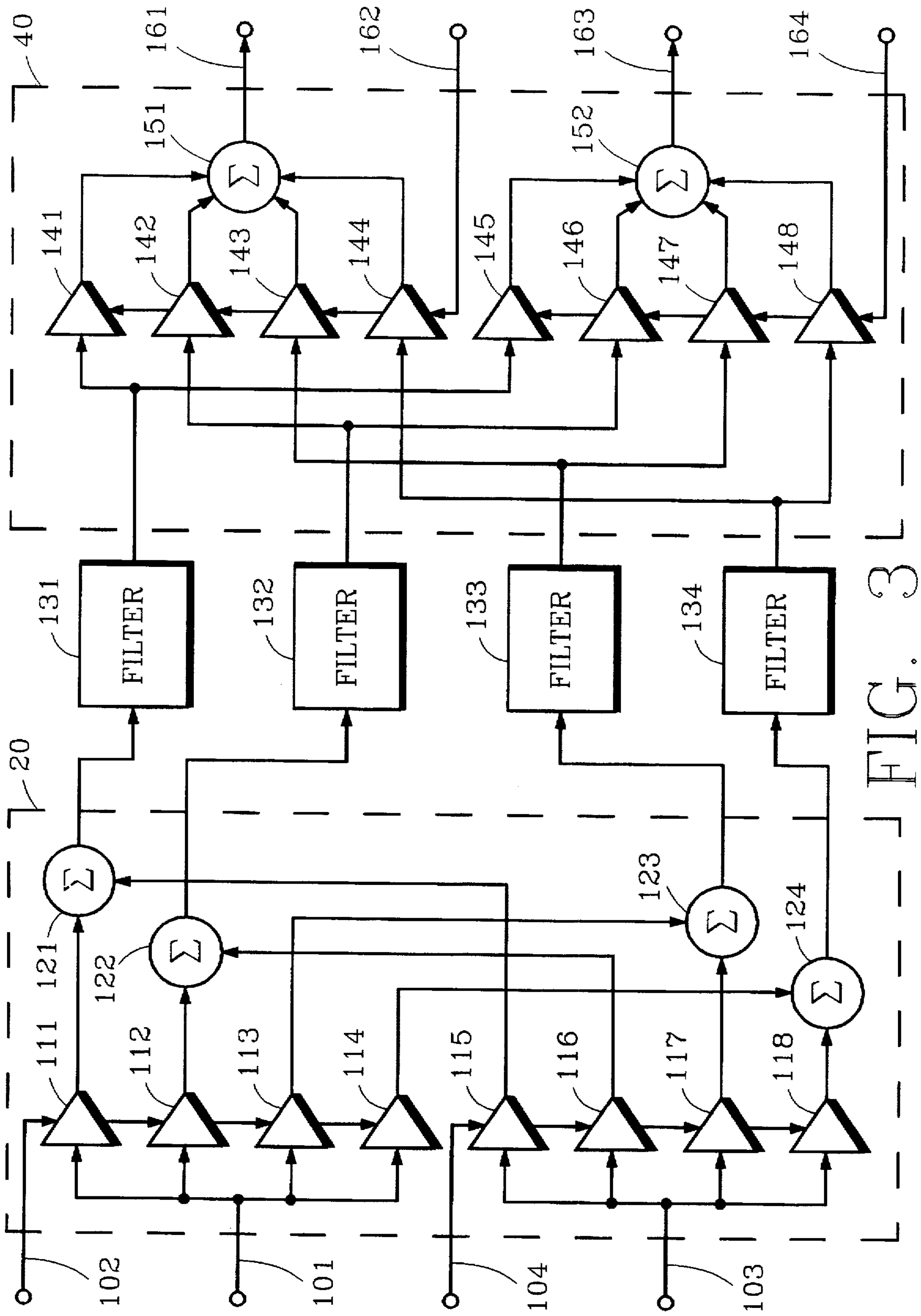
FIG. 3 is a functional block diagram illustrating one implementation of HRTF according to the present invention for use in an acoustic display for presentation of multiple sources in multiple output signals.

A functional block diagram shown in FIG. 3 illustrates one structure of a device according to the teachings of the present invention which implements HRTF for multiple audio sources and multiple output signals. The structure and operation are substantially a combination of the structures and operations shown in FIGS. 1 and 2 and described above except that, preferably, the gains of amplifiers 141–148 are not adapted in response to signals received from paths 102 and 104.

In an alternative embodiment discussed below, the respective gains of amplifiers 111–118 and/or amplifiers 141–148 may be adapted to effectively dedicate certain filters to particular audio sources and/or output signals to trade off accuracy of spatialization against numbers of sources and/or listeners.

Hybrid Structure

Figure 4:
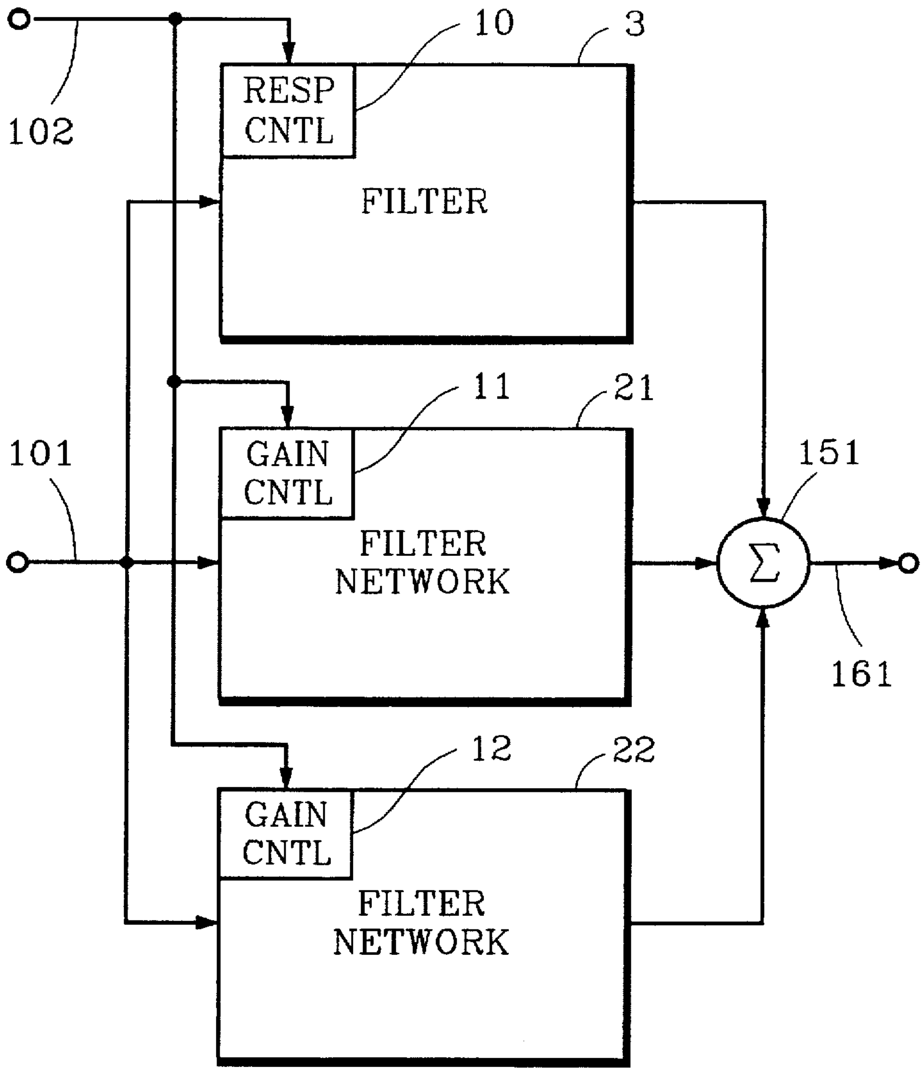
FIG. 4 is a functional block diagram illustrating one implementation of a HRTF according to the present invention comprising a hybrid structure of filters with varying and unvarying frequency response characteristics.

A functional block diagram shown in FIG. 4 illustrates a hybrid filtering structure incorporated into a device according to the teachings of the present invention which implements a HRTF for one audio source and one output signal. Filter 3 and filter networks 21 and 22 each apply a filter to an audio signal received from path 101 representing an audio source. Filter 3 applies a filter having frequency response characteristics adapted by response control 10 in response to a direction signal and/or ambient signal received from path 102. Filter network 21 applies a filter having unvarying frequency response characteristics and utilizes an amplifier having a gain adapted by gain control 11 in response to the direction signal and/or ambient signal received from path 102. Filter network 22 applies a filter having unvarying frequency response characteristics and utilizes an amplifier having a gain adapted by gain control 12 in response to the direction signal and/or ambient signal received from path 102. The signals resulting from filter 3 and filter networks 21 and 22 are combined by combiner 151 and the resulting output signal is passed along path 161.

The Ambient and direction signals received from path 102 represent the desired ambient characteristics and apparent direction of the source of the audio signal received from path 101. In an alternative embodiment, response control 10 and gain controls 11 and 12 may respond to other signals such as position signals representing position and/or orientation of a listener.

Figure 5A:
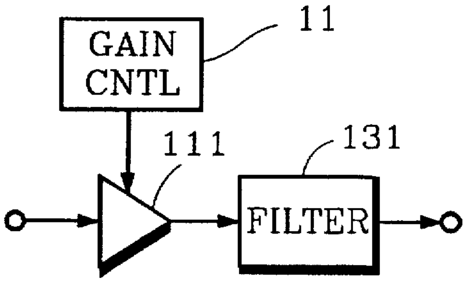
Figure 5B:
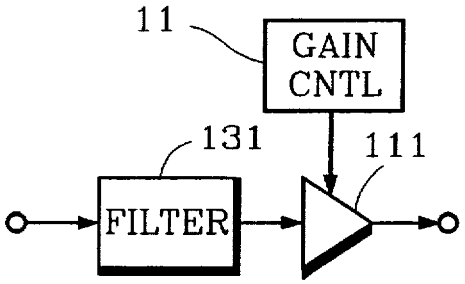

As shown in FIGS. 5*a* and 5*b*, the filter networks may be implemented by an amplifier 111 with gain adapted in response to gain control 11 and a filter 131. In one embodiment, the filter is coupled to the output of the amplifiers. In another embodiment, the amplifier is coupled to the output of the filter.

Referring to FIG. 6, in one application filter 3 generates a direct-path response along path 160 by applying a filter to an audio signal received from path 101. Filter 131 applies a filter to the audio signal and passes the filtered signal to amplifiers 141, 143, 145 and 147 which amplify the filtered signal. Filter 132 applies a filter to the audio signal and passes the filtered signal to amplifiers 142, 144, 146 and 148 which amplify the filtered signal. Combiner 151 combines signals received from amplifiers 141 and 142 and passes the combined signal to delay element 171. Combiners 152–154 combine the signals received from the remaining amplifiers and pass the combined signals to respective delay elements 172–174. Combiner 155 combines delayed signals received from delay elements 171 and 172 and passes the resulting signal along path 161. Combiner 156 combines delayed signals received from delay elements 173 and 174 and passes the resulting signal along path 163. If a binaural presentation is desired, the signals passed along paths 160 and 161 are combined for presentation to one ear and the output from a second filter 130, not shown, is combined with the signal passed along path 163 for presentation to the second ear.

A direction signal received from path 102 represents the desired apparent direction of the source of the audio signal received from path 101. An ambient signal, if received from path 102, represents various ambient characteristics such as source aspect angle or source radiation characteristic. Position signals received from paths 162 and 164 represent position and/or orientation information for each ear of one listener or position information for two listeners. Ambient signals, if received from paths 162 or 164, represent various ambient characteristics unique to a particular listener such as the reflection geometry of the ambient environment around that listener. In the embodiment illustrated, filter 3 adapts frequency response characteristics in response to the location signal and, optionally, an ambient signal. Respective gains of amplifiers 141–144 are adapted in response to the direction signal and any ambient signal received from path 102, and the position signal and any ambient signal received from path 162, and respective gains of amplifiers 145–148 are adapted in response to the direction signal and any ambient signal received from path 102, and the position signal and any ambient signal received from path 164. For example, the gains of these amplifiers are adapted according to the direction of arrival for a reflected soundwave to be synthesized, the distance of the source, and various reverberant characteristics.

Delay elements 171 and 172 can impose signal delays of a duration adapted in response to an ambient signal received from path 102 and the position signal received from path 162. Delay elements 173 and 174 can impose signal delays of a duration adapted in response to an ambient signal received from path 102 and the position signal received from path 164. The durations of the respective delays can be adapted according to the length of the propagation path of respective reflected soundwaves.

Additional amplifiers, combiners and delay elements may be incorporated into the illustrated embodiment to increase the number of synthesized reflected soundwaves and/or the number of output signals. These additional components do not significantly increase the complexity of the HRTF because the number of filters used to synthesize reflections is unchanged.

Derivation of Filters

Efficiency of implementation may be achieved in each of the structures discussed above by utilizing an appropriate set of N filters having unvarying frequency response or, equivalently, unvarying impulse response characteristics. For discrete-time systems, these filters may be derived from an optimization process which derives an impulse response $q_j(t_p)$ for each filter in a set of N unit-energy filters that, when weighted and summed, form a composite impulse response $\hat{h}(\theta,\phi,\alpha,t_p)$ providing the best approximation to each impulse response $h(\theta,\phi,\alpha,t_p)$ in a target set of M impulse responses. Preferably, the target set H of M impulse responses represents an individual listener, real or imaginary, having localization characteristics which represent a large segment of the population of intended listeners. The target set H of M impulse responses for each of B ambient characteristics may be expressed as $$H=\{h(\Theta_i,A_b,t_p)\} \text{ for } 0\leq p<P \tag{1}$$

where $\Theta_i$ denotes a particular relative direction $(\theta,\phi)$, $A_b$ denotes one or more ambient characteristics, $t_p$ denotes discrete sample times, and P is the length of the impulse responses in samples.

Preferably, the angular spacing between adjacent directions is no more than 30 to 45 degrees in azimuth and 20 to 30 degrees in elevation. The composite impulse response $\hat{h}(\Theta_i,\alpha,t)$ of the weighted and summed set of N filter impulse responses may be expressed as $$\hat{h}(\Theta_i,A_b,t_p)=\sum_{j=0}^{N} w_j(\Theta_i,A_b)\cdot q_j(t_p) \tag{2}$$

where $w_j(\Theta_i,A_b)$ is the corresponding weight or coefficient for the impulse response of filter j at direction $\Theta_i$ for ambient characteristics $A_b$.

The derivation process seeks to optimize the approximation by minimizing the square of the approximation error over all impulse responses in the target set H, and may be expressed as $$\|H-\hat{H}\|_F=\sum_{i=0}^{M-1}\sum_{b=0}^{B-1}\sum_{p=0}^{P-1}(h(\Theta_i,A_b,t_p)-\hat{h}(\Theta_i,A_b,t_p))^2 \quad \text{for } 0<N<M \tag{3}$$

where $\|\chi\|_F$ denotes the Forbenious norm of $\chi$, and $\hat{H}$ is a set of M composite impulse responses $\hat{h}(\Theta_i,A_b,t_p)$.

According to expression 2, the set $\hat{H}$ may be expressed as $$\hat{H}=W\cdot Q \tag{4}$$

where W denotes an N×B*M matrix of coefficients $w_j(\Theta_i, A_b)$, and

Q denotes a set of N impulse responses $q_j(t_p)$.

This decomposition allows the optimization of expression 3 to be expressed as $$\min_{W,Q}(\|H-W\cdot Q\|_F) \tag{5}$$

By recognizing that the Forbenious norm is invariant under orthonormal transformation, it may be seen that the set of N impulse responses Q are the left singular vectors associated with the N largest singular values of H and that the coefficient matrix W is the product of the corresponding right singular vectors and diagonal matrix of singular values. The Forbenious norm of the approximation error is the sum of the M–N smallest singular values.

The optimization process described above is known as "singular value decomposition" and derives a set of impulse responses $q_j(t_p)$ which are orthogonal. Additional information about singular value decomposition and the Forbenious norm may be obtained from Golub, et al., "Matrix Computations," Johns Hopkins University Press, 2nd ed., 1989, pp. 55–60, 70–78. Other decomposition processes and norms such as those disclosed by Golub, et al. may be used to derive the W and Q matrices.

The choice of impulse response in the target set H affects the resultant filters Q. For example, filters for use in a display providing only azimuthal localization may be derived from a set of impulse responses for directions which lie only in the horizontal plane. Similarly, filters for use in a display in which azimuthal localization is much more important than elevation localization may be derived from a target set H which comprises many more impulse responses for directions in the horizontal plane than for directions above or below the horizontal plane. If ambient effects are to be included, the target set H can comprise sets of impulse responses for various ambient characteristics such as air absorption loses as a function of distance or acoustic characteristics of reflective materials in the ambient environment. The target set H may comprise impulse responses for a single ear or for both ears of one individual or of more than one individual. It should be understood, however, that as the number of impulse responses in the target set H increases, the number of impulse responses in the set Q must also increase to achieve a given level of approximation error.

As another example, a set of filters which optimize only the magnitude response of HRTF may be derived from a target set H which comprises linear- or minimum-phase impulse responses, or impulse responses which are time aligned in some manner. The phase response may be synthesized separately by ITD, discussed below.

The optimization process described above assumes that the impulse responses $q_j(t_p)$ in target set H correspond to HRTF comprising both directionally-dependent aspects and directionally-independent aspects such as ear canal resonance. The process may also derive filters from impulse responses corresponding to other ATF such as DTF, for example, from which a common characteristic has been removed. The derived filters, taken together, approximate the ATF and the common characteristic excluded from the optimization may be provided by a separate filter. This is illustrated in FIGS. *7a* and *7b*.

Referring to FIG. *7a*, amplifier network 20 amplifies and combines the audio signals received from paths 101 and 103 to generate a set of intermediate signals which are passed to the set of N filters 131–134 derived by the optimization process, each of filters 131–134 applies a filter to a respective intermediate signal, combiner 151 combines the filtered signals to generate a composite signal, and filter 130 generates an output signal along path 161 by applying a filter having the common characteristics excluded from filters 131–134 to the composite signal. This structure corresponds to the structure illustrated in FIG. 1 and is preferred in applications where the number of audio signals exceeds the number of output signals.

Referring to FIG. *7b*, filter 130 generates an intermediate signal by applying a filter having the common characteristics excluded from filters 131–134 to the audio signal received from path 101, the set of N filters 131–134 derived by the optimization process each filter the intermediate signal received from filter 130, and amplifier network 40 amplifies and combines the filtered signals to generate output signals along paths 161 and 163. This structure corresponds to the structure illustrated in FIG. 2 and is preferred in applications where the number of output signals exceeds the number of audio signals.

It may be of interest to note that if the common characteristic excluded from the optimization process corresponds to the directionally-independent aspects of HRTF, then the first derived impulse response $\hat{h}(\Theta_i,A_b,t_p)$ is substantially equal to the Dirac delta function.

As mentioned above, the number of filters required to achieve a given approximation error depends on the impulse responses constituting the target set H. Preferably, a set of linear- or minimum-phase impulse responses are used because the approximation error is expected to decrease more rapidly for increasing N than would occur for impulse responses including ITD which are not aligned in time with one another.

An acoustic display incorporating a set of filters and weights derived according to the process described above can spatialize an audio signal to any given direction $\Theta_k$ and for any desired ambient effect $A_m$ by calculating a set of weights $w_j(\Theta_k,A_m)$ appropriate for the given direction and effect, using the weights to set amplifier gains. The weights for a given direction can be calculated by linearly interpolating between weights $w_j(\Theta_k,A_m)$ corresponding to the directions $\Theta_i$ and effects $A_b$ closest to the given direction and effects.

In concept, each filter convolves a time-domain signal with a respective impulse response. Filtering may be accomplished in a variety of ways including recursive or so called infinite impulse response (IIR) filters, nonrecursive or so called finite impulse response (FIR) filters, lattice filters, or block transforms. No particular filtering technique is critical to the practice of the present invention; however, it is important to note that the composite filter response actually achieved from a filter implemented according to expression 2 may not match the desired composite impulse response derived by optimization. In preferred embodiments, the filters are checked to ensure that the difference between the desired impulse response and the actual impulse response is small. This check must take into account both magnitude and phase; therefore, the technique used to implement the filters must either preserve phase or otherwise account for changes in phase so that correct results are obtained from the weighted sum of the impulse responses.

Alternative Derivations

There are several alternative techniques for deriving the filters. The first alternative is based on a recognition that in many applications, not all directions $\Theta_i$ and not all ambient effects $A_h$ are equally important to spatialization. Furthermore, not all combinations of direction and ambient effect are equally important. Those directions and ambient effects that are important should be emphasized or, conversely, those directions and ambient effects that are unimportant should be deemphasized. This may be accomplished using any combination of three ways.

One way which deemphasizes particular impulse responses essentially downsamples unimportant impulse responses in the respective dimension. For example, if impulse responses for high-elevation directions are not as important, the angular spread between adjacent impulse responses in the set H can be increased for high elevations. If impulse responses for long-range distances are not as important, the linear distance between adjacent impulse responses in the set H can be increased for large distances. A similar downsampling can be done for other ambient characteristics such as acoustic properties of reflective surfaces. In a similar manner, downsampling can be carried out for impulse responses corresponding to various combinations of direction and ambient characteristics that are not deemed to be as important as other combinations.

A second way to deemphasize an impulse response is to use scaling or weighting factors which vary in value according to the importance of the impulse response. The values of the coefficients in matrix W can be adjusted to account for the scaling factors.

A third way to deemphasize impulse responses $h(\Theta,\phi,\alpha,t_p)$ for particular directions or ambient characteristics is to smooth those responses in the frequency domain prior to deriving the set of impulse responses $Q=\{q_j(t_p)\}$. Such smoothing removes detail or information, leaving only the gross spectral features of the responses, and shortens the corresponding filter. Additional information may be obtained from international patent application no. PCT/US 95/04839, published Nov. 23, 1995 as WO 95/31881, which is incorporated herein by reference in its entirety.

The second alternative performs derivations for separate target sets $H_s$ of impulse responses. For example, a first target set $H_1$ could include impulse responses $h(\Theta,\phi,\alpha_1,t_p)$ for a source-to-listener distance of one meter, and additional target sets $H_s$ for $2 \leq s \leq 7$ could include impulse responses $h(\theta,\phi,\alpha_s,t_p)$ for six other distances, say two, four, eight, fifteen, twenty and fifty meters. The number of impulse responses in each target set H is reduced for increasing distances because the localization capabilities of a listener diminishes as distance increases. Mathematically speaking, this alternative is suboptimal because any correlation between the impulses responses derived for each set $H_s$ cannot be removed; however, this alternative can still be useful because mathematical objectives like minimizing the Forbenious norm do not derive a set of impulse responses which optimally represent features that are most important to the localization characteristics of the human auditory system.

An acoustic display incorporating filters having impulse responses derived in this manner would comprise two or more filter networks in parallel with one another. Each filter network corresponds to a set of impulse responses derived from a particular target set $H_s$ and could be arranged in some structure such as those illustrated in any of FIGS. 1–3.

The third alternative derives a first set of impulse responses over one target space, and derives a second set of impulse responses by minimizing the approximation error of over a larger target space. For example, suppose a first set of impulse responses $Q=\{q_j(t_p)\}$ is derived from a first target space of impulse responses $H_X=\{h(\theta,\phi,t_p)\}$ by minimizing the square of the approximation error over all impulse responses in the target set $H_x$ according to $$\min_{W_x,Q} (\|H_x - W_x \cdot Q\|_F) \tag{6}$$

where $\|\chi\|_F$ denotes the Forbenious norm of $\chi$, $W_X$ denotes an N×M matrix of coefficients $w_j(\Theta_i)$, and Q denotes a set of N impulse responses $q_j(t_p)$.

The Forbenious norm for this expression is:

$$\|H_X - \hat{H}_X\|_F = \sum_{i=0}^{M-1} \sum_{p=0}^{P-1} (h(\Theta_i, t_p) - \hat{h}(\Theta_i, t_p))^2 \quad \text{for } 0 < N < M \tag{7}$$

where $\hat{H}_X = W_X \cdot Q$ denotes a set of M composite impulse responses $\{\hat{h}(\Theta_i, t_p)\}$.

After deriving the first set of impulse responses Q, a second set of impulse responses $R=\{r_j(t_p)\}$ is derived by minimizing the square of the approximation error over a larger second target space of impulse responses $H_Y=\{h(\Theta_i, A_b, t_p)\}$ according to $$\min_{W_Y,Q} (\|H_Y - W_Y \cdot Q\|_F) \tag{8}$$

where $R=W_Y \cdot Q$, and $W_Y$ denotes an N×B*M matrix of coefficients $w_j(\Theta_i, A_b)$.

The fourth alternative derives a set of even and odd functions. This derivation is based on the assumption that HRTF can be expressed as a combination of even and odd functions of direction. Ignoring differences due to ITD and other delays, this assumption can be expressed as $$H_R(\Theta)=H_E(\Theta)+H_O(\Theta) \text{ and} \tag{9a}$$

$$H_L(\Theta)=H_E(-\Theta)+H_O(-\Theta)=H_E(\Theta)-H_O(\Theta) \tag{9a}$$

where $H_R(\Theta)$ denotes a DTF for the right ear, $H_L(\Theta)$ denotes a DTF for the left ear, $H_E(\Theta)$ denotes an even function of direction $\Theta$, and $H_O(\Theta)$ denotes an odd function of direction $\Theta$.

The even and odd functions can be derived from the DTF according to $$H_E(\Theta)=\tfrac{1}{2}(H_R(\Theta)+H_L(\Theta)) \text{ and} \tag{10}$$

$$H_O(\Theta)=\tfrac{1}{2}(H_r(\Theta)-H_L(\Theta)). \tag{10}$$

Having obtained the even and odd parts of the DTF, separate optimizations can be carried out to derive two sets of impulse responses. One set of impulse responses, $\{h_E(\Theta_i, A_b, t_p)\}$, are derived from a target space of impulse responses corresponding to the even parts of the DTF. A second set of impulse responses, $\{h_O(\Theta_i, A_b, t_p)\}$, are derived from a target space of impulse responses corresponding to the odd parts of the DTF. These separate derivations are similar in concept to the third alternative discussed above.

Empirical evidence suggests that the even function represents the principal parts of effects due to distance, source aspect angle, acoustic properties of reflective surfaces, and cues used by the human auditory system to distinguish between source directions in front and behind the listener. This same evidence suggests that the odd function represents the principal parts of cues used by the human auditory system to localize elevation of sources at extreme left and right locations. These characteristics may be used to emphasize and/or deemphasize impulse responses for particular directions and ambient characteristics, as discussed above for the first and second alternatives.

Dynamic Reconfiguration

The function performed by the structure illustrated in FIG. 3 may be expressed in algebraic form as $$P(t_p)=W_{out}(\Theta)\cdot Q\cdot W_{in}(\Theta)\cdot S(t_p) \tag{11}$$

where $P(t_p)$ denotes a column vector of output signals of length $L_{out}$, $S(t_p)$ denotes a column vector of input signals of length $L_{in}$, $W_{in}(\Theta)$ denotes an M×$L_{in}$ matrix of input coefficients, $W_{out}(\Theta)$ denotes an $L_{out}$×M matrix of output coefficients, and Q denotes an M×M diagonal matrix of filters.

This structure may implement HRTF for each input signal and output signal provided the matrix product $W_{out}(\Theta)\cdot Q\cdot W_{in}(\Theta)$ can be made to approximate the source-listener HRTF matrix. This approximation can be made if the matrix product is full rank.

If only one input signal is present, $L_{in}$ equals one, the rank of matrix $W_{in}$ equals one, and the matrix product may be rewritten as shown in the following expression:

$$X_{out}(\Theta)\cdot Q \tag{12a}$$

where $X_{out}(\Theta)$ denotes an $L_{out}$×M matrix. This condition results in a structure which is equivalent to the structure illustrated in FIG. 2. If only one output signal is needed, $L_{out}$ equals one, the rank of $W_{out}$ equals one, and the matrix product may be rewritten as shown in the following expression:

$$Q\cdot X_{in}(\Theta) \tag{12b}$$

where $X_{in}(\Theta)$ denotes an M×$L_{in}$ matrix. This condition results in a structure which is equivalent to the structure illustrated in FIG. 1. If the minimum rank of matrices $W_{in}$ and $W_{out}$ is K, however, the matrix product in expression 11 can be rewritten in a form shown in expressions 12a or 12b if K sets of filters Q are available; however, if only J<K sets of filters Q are available, then a rank J approximation of the rank K system may be used but spatialization performance will be degraded.

Referring to the structure illustrated in FIG. 3, for example, the filters may be configured into one set of four filters, two sets of two filters, four sets of one filter, or three sets each comprising either one or two filters. When configured as one set of four filters, the structure may implement HRTF for one source signal and any number of output signals, as shown in FIG. 2, or it may implement HRTF for any number of input signals and one output signal, as shown in FIG. 1. When configured as two sets of filters, the structure may implement HRTF for two source signals and any number of output signals or for any number of input signals and two output signals. Reconfiguration may be accomplished by setting the gains in various amplifiers to zero, thereby isolating the filters from certain input signals or from certain output signals.

Dynamic reconfiguration is useful in applications which must support a widely varying number of sources and listeners because a device of given complexity may easily trade off the accuracy of spatialization against the smaller of the number of input signals and output signals. Accuracy of spatialization can sometimes be sacrificed without noticeable effect when listener ability to localize is degraded. Such degradation occurs, for example, when listeners are distracted, overwhelmed by very large numbers of sound sources, or when a sound is difficult to localize. Examples of sounds which are difficult to localize are those generated by narrow-band or quiet short-duration signals, sounds which occur in a reverberant environment, or sounds which originate in particular regions such as directly overhead or at great distances from the listener.

Variations and Extensions

In preferred embodiments, the magnitude of HRTF response is implemented by linear- or minimum-phase filters and the phase of HRTF response is implemented by delays. Relative delays between left- and right-ear signals produce ITD which is an important azimuth cue. Delays may also be used to synthesize the arrival of reflections or to help simulate the effects of distance. Filtering and scaling may be used in addition to or instead of the filtering discussed above to synthesize various propagation and ambient effects such as air absorption, soundfield spreading losses, nonuniform source radiation patterns, and transmissive- and reflective-materials characteristics. This additional processing may be introduced in a wide variety of places. Although no particular implementation is critical to the practice of the present invention, some implementations are preferred. Preferably, delays, filtering and scaling are introduced at points in an embodiment which reduces implementation costs.

Throughout this discussion, reference is made to listener position and/or orientation. Orientation refers to the orientation of the head relative to the audio source location. Position, as distinguished from orientation, refers to the relative location of the source and the center of the head. Listener position and/or orientation may be obtained using a wide variety of techniques including mechanical, optical, infrared, ultrasound, magnetic and radiofrequency techniques, and no particular way is critical to the practice of the present invention.

Listener position and/or orientation may be sensed using headtracking systems such as the Bird magnetic sensor manufactured by Ascension Technology Corporation, Burlington, Vt., or the six-degree-of-freedom ISOTRAK II™, InsideTRAK™ and FASTRAK™ sensors manufactured by Polhemus Corporation, Colchester, Vt.

The position and orientation of a listener riding in a vehicle may also be sensed by using mechanical, magnetic or optical switches to sense vehicle location and orientation. This technique is useful for amusement or theme park rides in which listeners are transported along a track in capsules or other vehicles.

The position and orientation of a listener may be sensed from static information incorporated into the acoustic display. For example, position and orientation of listeners seated in a motion picture theater or seated around a conference table may be presumed from information describing the theater or table geometry.

Amplifier gain and/or time delays may be adapted to synthesize ambient effects in response to signals describing the simulated environment. Longer delays may be used to simulate the reverberance of larger rooms or concert halls, or to simulate echoes from distant structures. Highly reflective acoustic environments may be simulated by incorporating a large number of reflections with increased gain for late reflections. The perception of distance from the audio source can be strengthened by controlling the relative gain for reflected soundwaves and direct path soundwaves. In particular, the delay and direction of arrival of reflected soundwaves may be synthesized using information describing the geometry and acoustical properties of reflective surfaces, and position and/or orientation of a listener within the environment.

Amplifier gain and/or time delays may also be adapted to adjust HRTF responses to individual listener localization characteristics. ITD may be adjusted to account for variations in head size and shape. Amplifier gain may be adapted to adjust spectral shaping to account for size and shape of head and ear pinnae. In one embodiment of an acoustic display, a listener cycles through different coefficient matrices W while listening to the spatial effects and selects the matrix which provides the most desirable spatialization.

We claim:

1. A method for providing an acoustic display of aural information comprising the steps of:

receiving a plurality of audio signals and a plurality of direction signals representing a plurality of sources of aural information, wherein said direction signals represent apparent directions of said sources, receiving one or more ambient signals, generating one or more first signals in response to said one or more audio signals, a respective first signal generated by combining said plurality of audio signals according to a respective set of weights adapted in response to said direction signals and said one or more ambient signals, generating a plurality of filtered signals by filtering said first signals according to a plurality of filters having respective unvarying impulse responses which are substantially mutually orthogonal, and generating one or more output signals in response to said filtered signals.

2. A method for providing an acoustic display of aural information comprising the steps of:

receiving one or more audio signals and one or more direction signals representing one or more sources of aural information, wherein said direction signals represent apparent directions of said sources, receiving one or more ambient signals, generating one or more first signals in response to said one or more audio signals, generating a plurality of filtered signals by filtering said first signals according to a plurality of filters having respective unvarying impulse responses which are substantially mutually orthogonal, and generating a plurality of output signals in response to said filtered signals, a respective output signal generated by combining said plurality of filtered signals according to a respective set of weights adapted in response to said direction signals and said one or more ambient signals.

3. A method according to claim 1 or 2 wherein said one or more ambient signals represent ambient effects due to air absorption, source radiation patterns, source aspect angle, acoustic-transmission properties of materials, and/or acoustic-reflection properties of materials.

4. A method according to claim 1 or 2 wherein said plurality of filters have unvarying impulse responses such that weighted sums of said unvarying impulse responses provide substantially optimum approximations to each impulse response in a target set of impulse responses, and wherein the number of said plurality of filters is less than the number of impulse responses in said target set.

5. A method according to claim 4 wherein said target set comprises impulse responses that are functions of direction and one or more ambient effects, and wherein at least some of said impulse responses in said target set are deemphasized according to relative importance to accurate spatialization.

6. A method according to claim 1 or 2 wherein said plurality of filters have unvarying impulse responses such that weighted sums of said unvarying impulse responses provide substantially optimum approximations to each impulse response in two or more target sets of impulse responses, and wherein the number of said plurality of filters is less than the number of impulse responses in each of said target sets.

7. A method according to claim 6 wherein each of said target sets comprises impulse responses corresponding to a particular distance.

8. A method according to claim 6 wherein one of said target sets comprises impulse responses corresponding to even functions of direction, and wherein another of said target sets comprises impulse responses corresponding to odd functions of direction.

9. An acoustic display of aural information comprising:

first terminals receiving one or more audio signals and one or more direction signals representing one or more sources of aural information, wherein said direction signals represent apparent directions of said sources, one of more second terminals receiving one or more ambient signals, first network means coupled to said first terminals for generating one or more first signals in response to said one or more audio signals, filter means coupled to said first network means for generating a plurality of filtered signals by filtering said first signals according to a plurality of filters having respective unvarying impulse responses which are substantially mutually orthogonal, and second network means coupled to said filter means for generating one or more output signals in response to said filtered signals, wherein said first terminals receive a plurality of audio signals, said first network means generates a respective first signal by combining said plurality of audio signals according to a respective set of weights adapted in response to said direction signals and said one or more ambient signals, and/or wherein said second network means generates a plurality of output signals, a respective output signal generated by combining said plurality of filtered signals according to a respective set of weights adapted in response to said direction signals and said one or more ambient signals.

10. An apparatus for providing an acoustic display of a plurality of audio sources, wherein each of said plurality of audio sources provides aural information at an audio output and provides apparent location information at a location output, said system comprising:

a terminal receiving one or more ambient signals representing ambient effects, a plurality of amplifier groups, each comprising a plurality of amplifiers each having an input coupled to a respective audio output and comprising a gain control coupled to a respective location output, wherein at least some of said amplifiers have a respective gain control also coupled to said terminal, a plurality of first combining circuits each having a plurality of inputs, each of said first combining circuits having a respective input coupled to an output of an amplifier in a respective amplifier group, a plurality of filters each having an input coupled to an output of a respective first combining circuit of said plurality of first combining circuits and each filter having a respective unvarying impulse response in a plurality of impulse responses, wherein said plurality of impulse responses are substantially mutually orthogonal, a second combining circuit having a plurality of inputs, a respective input coupled to an output of a respective filter of said plurality of filters, and an output terminal coupled to an output of said second combining circuit.

11. An apparatus for providing an acoustic display of an audio source, wherein said audio source provides aural information at an audio output and provides apparent location information at a location output, said system comprising:

a terminal receiving one or more ambient signals representing ambient effects, a plurality of filters each having an input coupled to said audio output and each having a respective impulse response in a plurality of impulse responses, wherein said plurality of impulse responses are substantially mutually orthogonal, a plurality of amplifier groups, each comprising a plurality of amplifiers each having an input coupled to an output of a respective filter of said plurality of filters and comprising a gain control coupled to said location output, wherein at least some of said amplifiers have a respective gain control also coupled to said terminal, a plurality of combining circuits, a respective combining circuit having a plurality of inputs coupled to outputs of amplifiers in a respective one of said plurality of amplifier groups, and a plurality of output terminals, each coupled to an output of a respective combining circuit of said plurality of combining circuits.

12. An apparatus according to claim 9, 10 or 11 wherein said one or more ambient signals represent ambient effects due to air absorption, source radiation patterns, source aspect angle, acoustic-transmission properties of materials, and/or acoustic-reflection properties of materials.

13. An apparatus according to claim 9, 10 or 11 wherein said plurality of filters have unvarying impulse responses such that weighted sums of said unvarying impulse responses provide substantially optimum approximations to each impulse response in a target set of impulse responses, and wherein the number of said plurality of filters is less than the number of impulse responses in said target set.

14. An apparatus according to claim 13 wherein said target set comprises impulse responses that are functions of direction and one or more ambient effects, and wherein at least some of said impulse responses in said target set are deemphasized according to relative importance to accurate spatialization.

15. An apparatus according to claim 9, 10 or 11 wherein said plurality of filters have unvarying impulse responses such that weighted sums of said unvarying impulse responses provide substantially optimum approximations to each impulse response in two or more target sets of impulse responses, and wherein the number of said plurality of filters is less than the number of impulse responses in each of said target sets.

16. An apparatus according to claim 15 wherein each of said target sets comprises impulse responses corresponding to a particular distance.

17. An apparatus according to claim 15 wherein one of said target sets comprises impulse responses corresponding to even functions of direction, and wherein another of said target sets comprises impulse responses corresponding to odd functions of direction.

* * * * *